United States Patent
Boerstler et al.

(10) Patent No.: US 6,480,049 B2
(45) Date of Patent: Nov. 12, 2002

(54) MULTIPHASE CLOCK GENERATOR

(75) Inventors: David William Boerstler, Round Rock, TX (US); Robert Keven Montoye, Austin, TX (US); Kevin John Nowka, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/996,043

(22) Filed: Nov. 28, 2001

(65) Prior Publication Data

US 2002/0140486 A1 Oct. 3, 2002

Related U.S. Application Data

(62) Division of application No. 09/820,460, filed on Mar. 29, 2001.

(51) Int. Cl.[7] .................................................. H03K 3/00
(52) U.S. Cl. ..................... 327/299; 327/254; 327/244; 327/159; 331/DIG. 2; 375/376; 365/223.5
(58) Field of Search .................................. 327/291, 293, 327/294, 298, 299, 144, 146–148, 150, 155–157, 159, 165, 166, 231, 238, 243–244, 254; 331/1 A, DIG. 2; 375/373–376, 359; 365/233, 233.5

(56) References Cited

U.S. PATENT DOCUMENTS

| 5,270,669 A | * | 12/1993 | Jokura | 327/105 |
| 5,391,996 A | * | 2/1995 | Marz | 327/158 |
| 5,748,044 A | * | 5/1998 | Xue | 331/10 |
| 6,150,886 A | * | 11/2000 | Shimomura | 331/2 |

* cited by examiner

Primary Examiner—Timothy P. Callahan
Assistant Examiner—Minh Nguyen
(74) Attorney, Agent, or Firm—Richard F. Frankeny; Winstead Sechrest & Minick P.C.; Casimer K. Salys

(57) ABSTRACT

The Sync State outputs are used in combination with the multiple phase outputs to generate and error signal which is operable to generate voltage which controls the frequency of the MVCO and to generate a shifted clock which is divided in a sequential circuit to generate the quadrature clock with a frequency F.

48 Claims, 13 Drawing Sheets

| SYNC STATE | Q1/Q1N | Q2/Q2N | Q3/Q3N | Q4/Q4N | Q5/Q5N |
|---|---|---|---|---|---|
| SS1 | X | 0 | 0 | 1 | 1 |
| SS2 | 1 | X | 0 | 0 | 1 |
| SS3 | 1 | 1 | X | 0 | 0 |
| SS4 | 0 | 1 | 1 | X | 0 |
| SS5 | 0 | 0 | 1 | 1 | X |

SYNCH STATE TABLE

FIG. 4A

| SYNCH STATE | Q1/Q1N | Q2/Q2N | Q3/Q3N | Q4/Q4N | Q5/Q5N | error |
|---|---|---|---|---|---|---|
| SS1 | 0 | 0 | 0 | 1 | 1 | 1 |
| SS1 | 1 | 0 | 0 | 1 | 1 | 0 |
| SS2 | 1 | 0 | 0 | 0 | 1 | 1 |
| SS2 | 1 | 1 | 0 | 0 | 1 | 0 |
| SS3 | 1 | 1 | 0 | 0 | 0 | 1 |
| SS3 | 1 | 1 | 1 | 0 | 0 | 0 |
| SS4 | 0 | 1 | 1 | 0 | 0 | 1 |
| SS4 | 0 | 1 | 1 | 1 | 0 | 0 |
| SS5 | 0 | 0 | 1 | 1 | 0 | 1 |
| SS5 | 0 | 0 | 1 | 1 | 1 | 0 |

ERROR STATE TABLE

FIG. 4B

MULTIPHASE CLOCK GENERATOR

This is a X division of application Ser. No. 09/820,460 filed Mar. 29, 2001.

BACKGROUND INFORMATION

Clock generation for digital systems generally requires clock frequencies that are stable, and in many cases the digital system clock frequencies are related by integer multiples. Typically, the master clock starts as the output of a crystal-controlled oscillator, then a digital version of the oscillator output is generated by various shaping circuits. These shaping circuits provide fast rise and fall times as well as symmetry between the two halves of the clock period. To generate clock signal symmetry, sometimes a higher frequency clock is divided down with a flip flop circuit to generate a clock with symmetrical half periods. In this method, various low frequency clocks may be generated from the master clock by again dividing down the master clock.

Many times, a phase lock loop (PLL) is used with a voltage-controlled oscillator (VCO) in a feedback loop to generate a high frequency clock from a lower frequency clock. In this way, the stable master clock is of a lower frequency which may be easier to generate. If the clock is for a digital processing system employing a central processor unit (CPU), which executes instructions relative to the clock period, then there are times when it is desirable to have certain functions of the CPU executing on sub-portions of the clock period, for example, on each half or quarter cycle. Having a stable high frequency clock where the clock period may be broken up into precise sub-periods is very desirable in operations within a computer and in various data recovery schemes used in digital communication.

One prior art way of generating M-multiple phases of a clock is to use a PLL employing a voltage-controlled oscillator (VCO) and a phase detector. The reference clock, of frequency F, is the input to the PLL, and the output frequency of the VCO is divided by M and compared to the reference clock in a phase comparator. Since the PLL may control the high frequency (M×F) clock so it is phase and frequency locked with the input reference clock, the transitions of the high frequency clock may be used to generate multiple phases of the reference clock. As clock frequencies become very high, generating an M times higher frequency clock, as a way of generating many multiple phases, may become prohibitive as M becomes larger (e.g., 5 to 10).

There is, therefore, a need for a way to generate M multiple phases of a high frequency clock of a frequency F using a reference clock with a frequency lower than normally required for a prior art multiphase clock generation.

SUMMARY OF THE INVENTION

A multiphase voltage-controlled oscillator (MPVCO) is used with a multiphase (MP) phase detector in a feedback configuration to generate specific multiple phase clocks that are phase and frequency locked to a reference clock. The MPVCO is used with corresponding logic circuits to generate a quadrature reference clock without generating frequencies higher than the reference clock. Another MPVCO is designed with a frequency of only two times higher than a reference clock, and with corresponding logic circuits generates 4×M equal phases of the reference clock where M is an integer characteristic of the MPVCO. In one exemplary embodiment of the present invention, M is equal to five and twenty phases of the reference clock may be generated.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which:

FIGS. 4A and 4B are tables showing the logic states of the sync state generator of FIG. 3;

DETAILED DESCRIPTION

Figure 1:
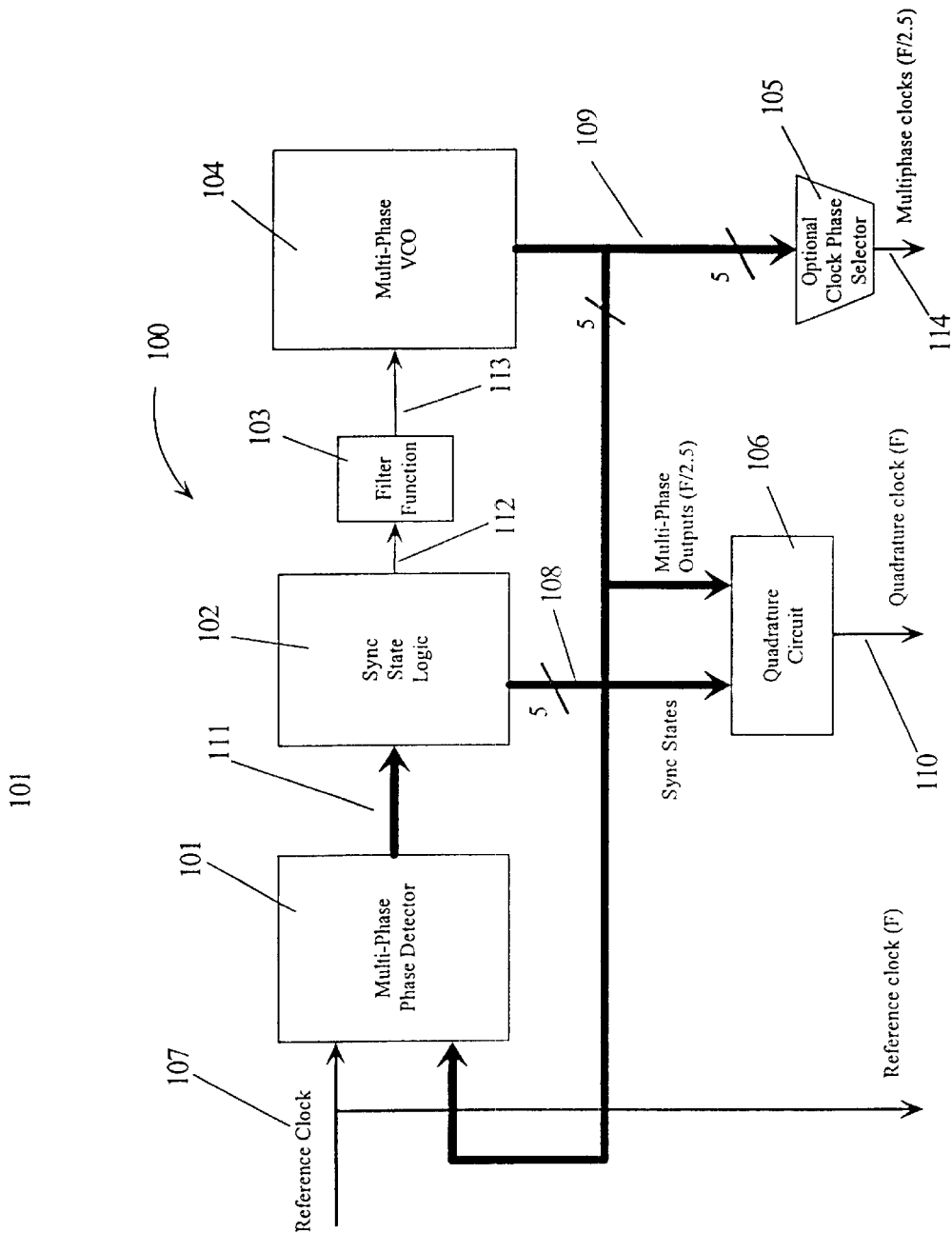
FIG. 1 is a block diagram of a system for generating a quadrature clock according to embodiments of the present invention.

In the following description, numerous specific details are set forth such as specific frequencies, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted in as much as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

FIG. 1 is a block diagram of the quadrature clock generator 100 according to an embodiment of the present invention. A multiphase voltage-controlled oscillator (MPVCO) 104 is implemented according to embodiments in the above cited applications incorporated herein by reference. The MPVCO 104 is designed to have a limited frequency adjustment range around a nominal frequency F/N where N is greater than one. Embodiments of the present invention generate a quadrature reference clock of a reference clock with frequency F without generating any frequencies high than F. In general, there are specific relationships between the values of N and the corresponding number of phases M generated by a particular MPVCO. To explain the operation of the present invention, particular values for M and N are used in some of the explanations.

In one particular embodiment of the present invention, MPVCO 104 is a five-phase MPVCO with a nominal clock frequency set to a value of 2.5 times lower than a particular reference clock 107 with frequency F. In this embodiment, a quadrature reference clock 110 with like frequency F is desired. Limiting the nominal frequency and the adjustment range of MPVCO 104 insures that MPVCO 104 will control to a desired frequency Reference clock 107 is coupled to multiphase (MP) phase detector 101 along with all the five phase outputs 109 from MPVCO 104. MP phase detector 101 generates five state signals 111 which in turn are coupled to Sync State Logic 102. Sync State Logic 102 generates an error signal 112 that is processed (filtered) by filter function 103 to generate a control voltage 113 to control the frequency of MPVCO 104. Sync State Logic 102 also generates Sync State signals 108 which are coupled to Quadrature logic circuit 106 along with the five output phases 109 of MPVCO 104. Quadrature logic circuit 106 generates Quadrature clock 110. Details of the operation of MPVCO 104 may be found in the referenced disclosures. The output of MPVCO 104 may be coupled to an optional clock phase selector 105 which allows different phases of the lower frequency clock to also be selected as a clock signal 114.

Figure 2:
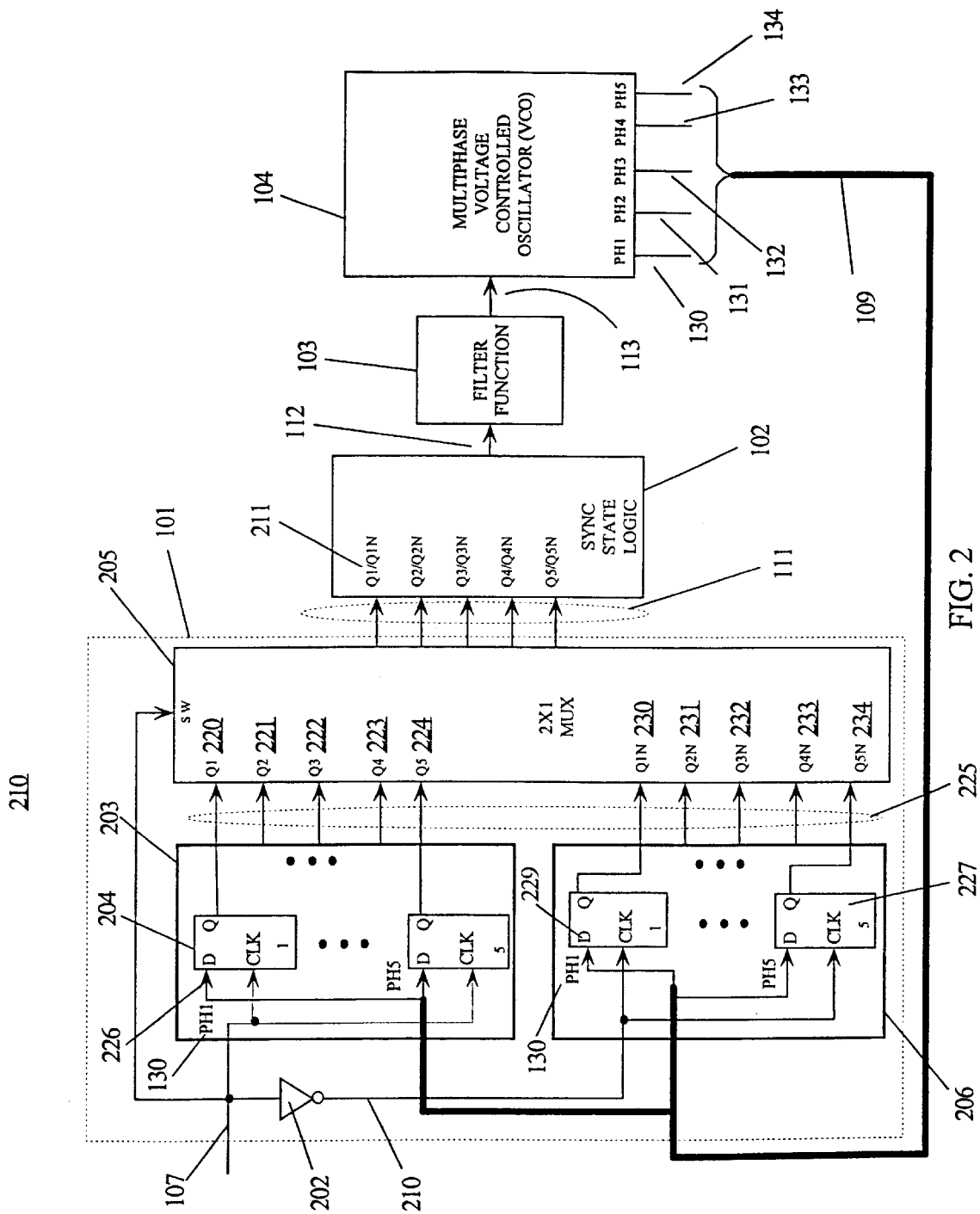
FIG. 2 is a more detailed block diagram of a multiphase detector used in embodiments of the present invention.

FIG. 2 is a more detailed block diagram of some of the circuit elements in FIG. 1. Reference clock F 107 is coupled to the clock input of five D-Type flip flops (FF) (e.g., D-Type FF 204) in data sampling unit 203. The D-Type FFs, in data sampling unit 203, latch the state of corresponding data inputs (e.g., D 226) on the positive edge of the reference clock 107 and hold the sampled results until the next positive edge of the reference clock 107. The five D-Type FFs, in data sampling unit 203, have the five phase outputs 109 from MPVCO 207 as their respective data inputs, for example, PH1 130 is coupled to the data input 226 of the first D-Type FF 204. The other output phases (PH 2 131 through PH 5 134) are coupled to a corresponding D-Type FF 2 through 5. Each output (coupled to Q1 220 through Q5 224 of Sync State logic 102) of these D-Type FFs are coupled to a corresponding input of a 2×1 multiplexor (MUX) 205. Data sampling unit 206 also has five D-Type FFs (e.g., first D-Type FF 221 and fifth D-Type FF 227). The D-Type FFs in data sampling unit 206 also have data inputs (e.g., D 229) coupled to corresponding phase outputs (PH1 130 through PH5 134) from MPVCO 104. The D-Type FFs in data sampling unit 206 are clocked with clock 210 which is generated by inverting clock 107 with inverter 202. Data sampling unit 206, thus, latches the states of the phases PH1 130 through PH5 134 on negative edges of clock 107 and generates outputs Q1N 230 through Q5N 234. The switch elements (not shown) in MUX 205 are two input one output selectors which are gated by clock 107. There are five selectors (not shown) in MUX 205 each receive an output from data sampling unit 203 and data sampling 206. For example, Q1 220 and Q1N 230 are inputs to one switch selector which directs Q1 220 to input Q1/Q1N 211 of Sync State logic 102 when clock 107 is positive and Q1N 230 to input Q1/Q1N 211 of Sync State logic 102 when clock 107 is negative. Each of the five switch selectors in MUX 205 is coupled to outputs of data sampling units 203 and 206 in a like manner. Sync State logic 102 generates (circuitry not shown, see referenced disclosures) an error signal 112 which is processed (filtered) by filter function 103 to generate the voltage control signal 113 for MPVCO 104. By designing MPVCO 104 to have a nominal operating frequency of 2.5 times lower than reference clock 107 and five phase outputs 109, the five phase outputs 109 have an operating range to insure that they will phase and frequency lock to reference clock 107.

Figure 3:
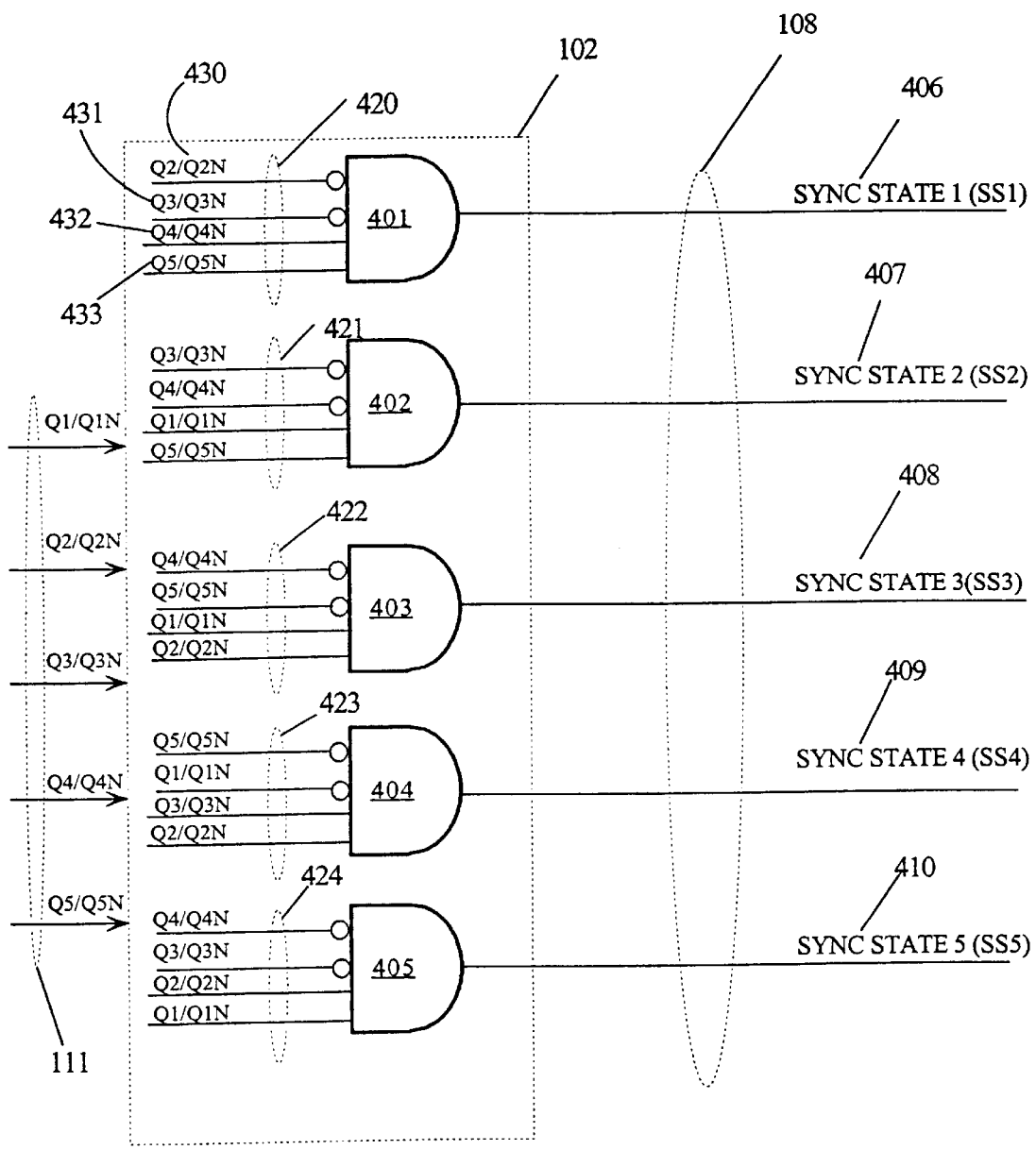
FIG. 3 is a circuit for generating synchronization states according to embodiments of the present invention.

FIG. 3 is a circuit diagram of additional logic in Sync State logic 102. Inputs 111 are directed as shown to inputs 420 through 424 of corresponding gates 401 through 405. Each gate (401 through 405) is a four input AND gate with two of the four inputs inverted (e.g., Q2/Q2N 430). For example, gate 401 inverts the inputs Q2/Q2N 430 and Q3/Q3N 431 for two of the inputs and receives inputs Q4/Q4N 432 and Q5/Q5N 433 as non-inverted signals. The inputs of gates 401 through 405 receive the outputs of MUX 205 as shown, and generate Sync State SS1 406, SS2 407, SS3 408, SS4 409 and SS5 410, respectively. The Sync States SS1 406 through SS5 410 are coupled to quadrature logic circuit 106 which is further described in FIG. 5. The timing diagram in FIG. 6 is used in a later discussion to show exemplary Sync State waveforms for Sync States SS1 406, SS2 407, SS3 408, SS4 409 and SS5 410.

FIG. 4A is a table illustrating the states of the outputs 111 of MUX 205 which generate logic true states for SS1 406 through SS5 410. FIG. 4B is a table illustrating the states of binary error signal 112 which depends on the states of Sync States SS1 406, SS2 407, SS3 408, SS4 409 and SS5 410 and Q1/Q1N 411, Q2/Q2N 430, Q3/Q3N 431, Q4/Q4N 432 and Q5/Q5N 433. The table in FIG. 4B illustrates that the error signal 112 is a binary signal determined by the particular Sync State (SS1 405 through SS5 410) and the transition state corresponding to the particular "Q" signal (marked X in FIG. 4A) not used to generate a particular Sync State. For example, Q1/Q1N 411 is not used to generate SS1 406. This binary error signal may be processed or filtered to generate the control voltage signal 113 for MPVCO 104.

Figure 5:
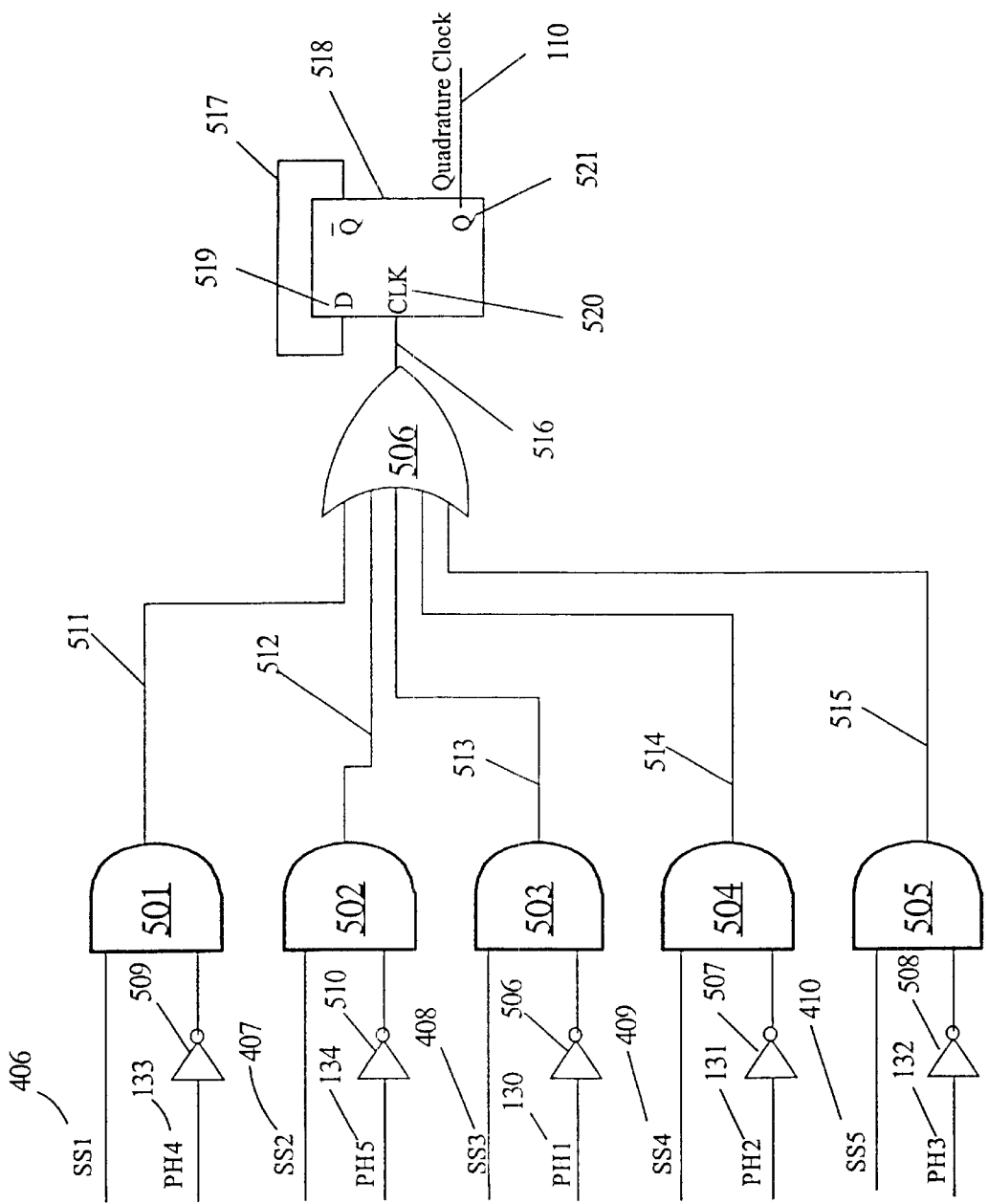
FIG. 5 is a circuit diagram of quadrature clock logic according to embodiments of the present invention.

FIG. 5 is a circuit diagram of logic in Quadrature logic circuit 106. AND gates 501 through 505 each receive one Sync State from Sync State logic 102 and one phase from phase signals 109, for example, AND gate 501 receives SS1 406 and inverted PH4 133. The phase signals, PH1 130 through PH5 134, are inverted by inverters 506 through 510 respectively. AND gate 502 receives SS2 407 and inverted PH5 134. AND gate 503 receives SS3 407 and inverted PH1 130. AND gate 504 receives SS4 409 and inverted PH2 131. AND gate 505 receives SS5 410 and inverted signal PH3 132. AND gates 501 through 505 generate outputs 511 through 515, respectively, which are ORed in OR gate 506, thereby generating shifted clock 516 for D-Type FF 518. D-Type FF 518 is connected (inverting output 517 coupled to data input 519 ) so it will alternatively change states on each positive edge of clock 516 thus generating Quadrature output 110. D-Type FF 518 latches the state of its data input on the positive edges of clock 516 applied to clock input 520. When D-Type FF 518 has a logic one on Quadrature output 110 (non-inverting output 521), it has a corresponding logic zero on inverting output 517 which is coupled back to data input 519. The next positive edge of clock 516 will cause Quadrature clock 110 to change from a logic one to a logic zero and likewise output 517 will change from a logic zero to a logic one. D-Type FF 518 thus changes its output states on each positive edge of clock 516. The timing diagrams in FIG. 6 illustrate the wave forms of the signals in FIG. 5 which generate Quadrature clock 110 corresponding to clock 107.

Figure 6:
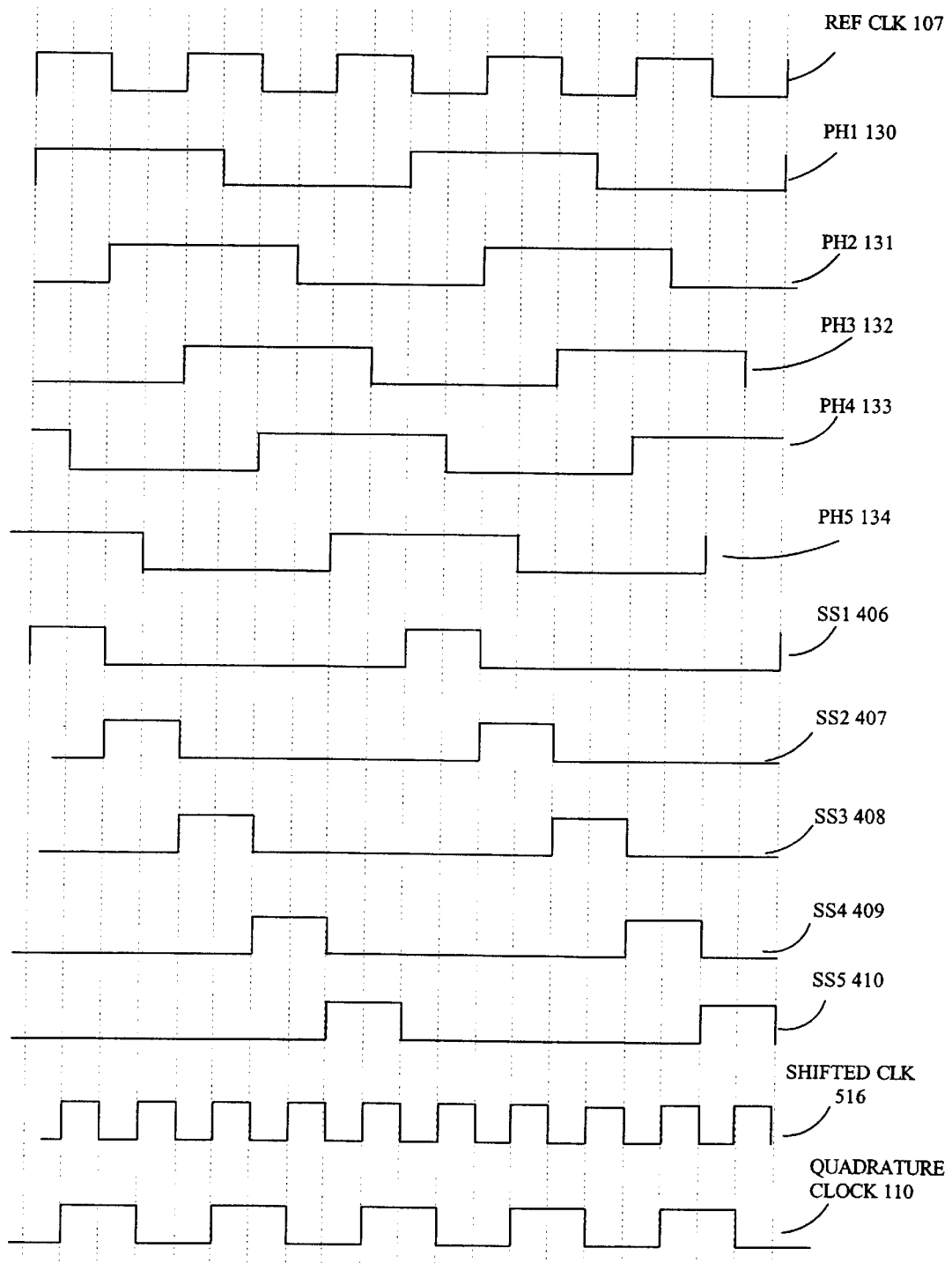
FIG. 6 is a timing diagram of signals in logic circuits used in embodiments of the present invention.

FIG. 6 is a timing diagram of embodiments of the present for generating a Quadrature clock. Reference clock 107 is shown in relation to the five output phases, PH1 130, PH2 131, PH3 132 PH4 133 and PH5 134, of MPVCO 104. Sync State logic 102 generates Sync States (SS)1 406 through SS5 410. Combining SS1 406 through SS5 410 with PH1 130 through PH5 134 generates shifted clock 516. Shifted clock 516 is divided by two by D-Type FF 518 to generate Quadrature clock 110.

Figure 7:
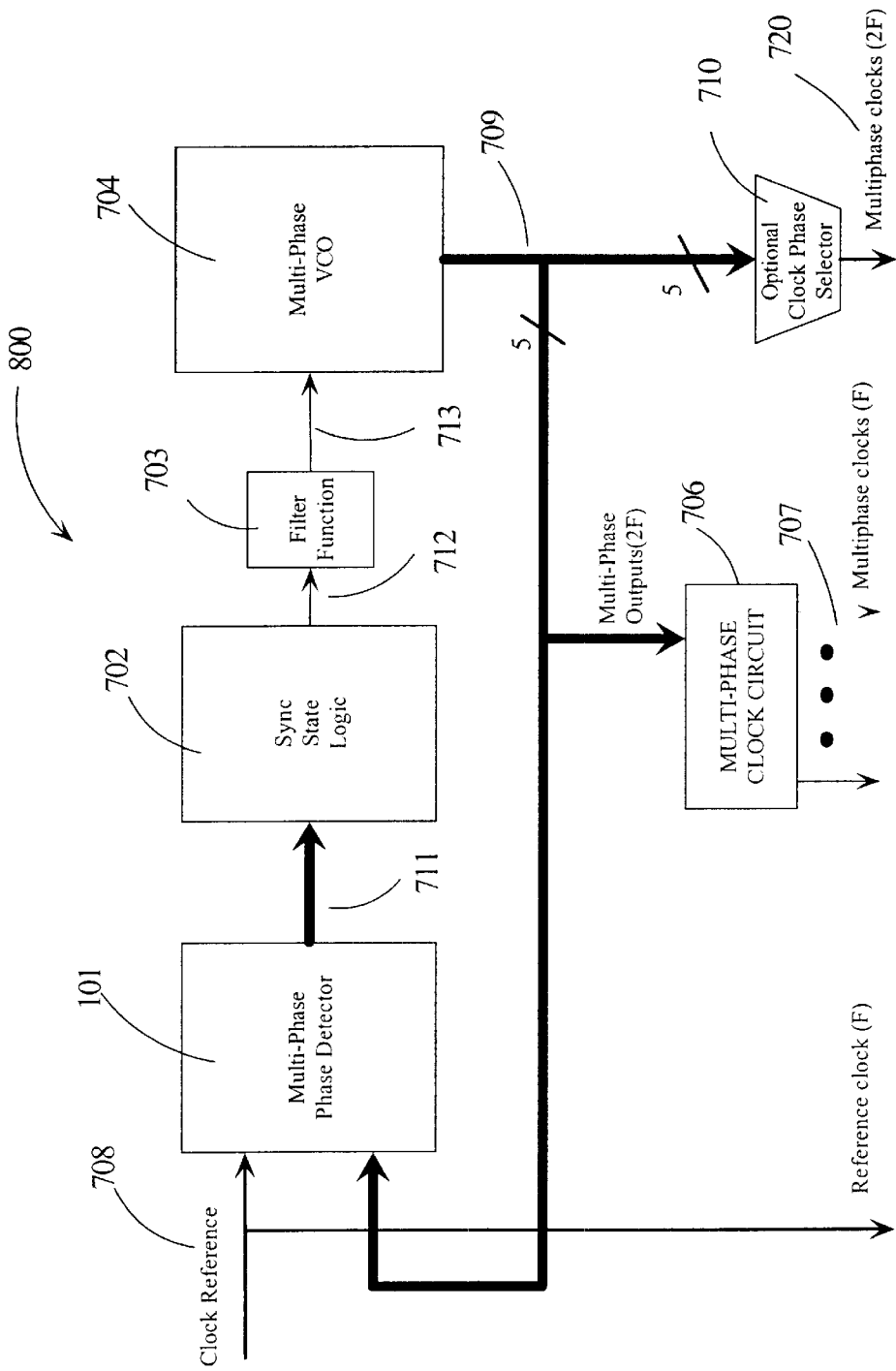
FIG. 7 is a block diagram of a multiple phase clock generator according to embodiments of the present.
Figure 10:
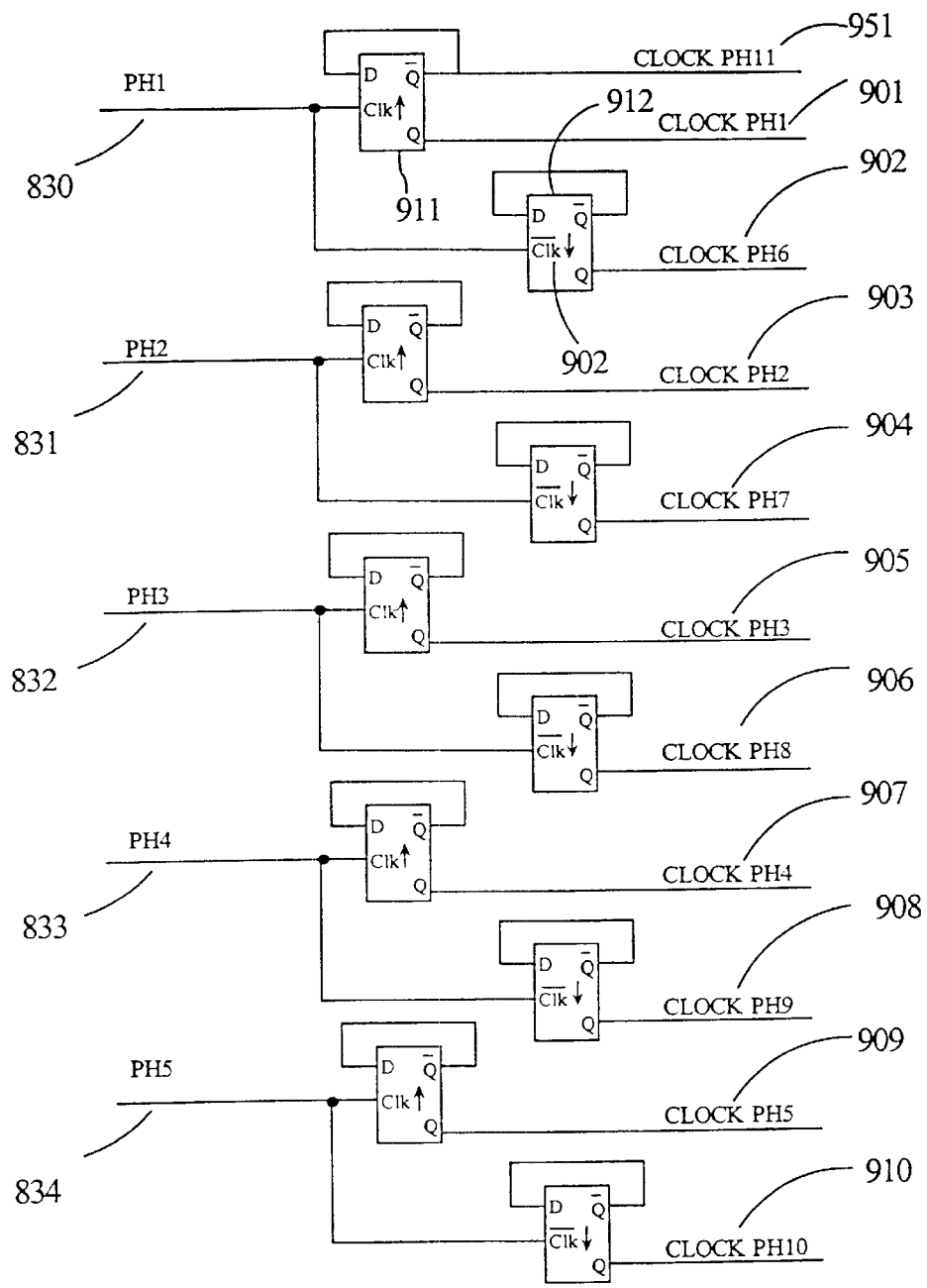
FIG. 10 is a circuit diagram of the multiple phase clock logic used in an embodiment of the present invention.

FIG. 7 is a block diagram of a multiple phase clock generator 800 according to embodiments of the present invention. The MPVCO 704 is implemented according to the referenced disclosures listed above which are hereby incorporated and is designed to have a limited frequency adjustment range around a nominal frequency. Embodiments of the present invention generate K multiple clock phases of a reference clock 708 with a frequency F by generating a frequency of only 2×F. In a particular embodiment of the present invention, the MPVCO 704 is a five-phase MPVCO with a nominal clock frequency set to a value of two times a particular reference clock 107 with frequency F for which a multiphase clock 707 with like frequency F is desired. The particular reference clock 708 is coupled to multiphase (MP) phase detector 101 along with all the five phase output signals 709 from MPVCO 704. MP phase detector 101 generates detector outputs 711 which in turn are coupled to Sync State Logic 702. Sync State Logic 702 generates an error signal 712 that is processed (filtered) by filter function 703 to generate a control voltage 713 for MPVCO 704. Multiphase clock circuit 706 generates multiple phases of reference clock 708 from the five output phases of MPVCO 704. FIG. 10 and the corresponding waveforms in FIG. 11 further explain the generation of clocks 707 according to embodiments of the present invention. The details of the operation of MPVCO 704 are found in the referenced disclosure(s). An optional clock phase selector 710 may be used to select one of the multiphase outputs 720 for an alternative multiphase clock output with frequency 2F.

Figure 8:
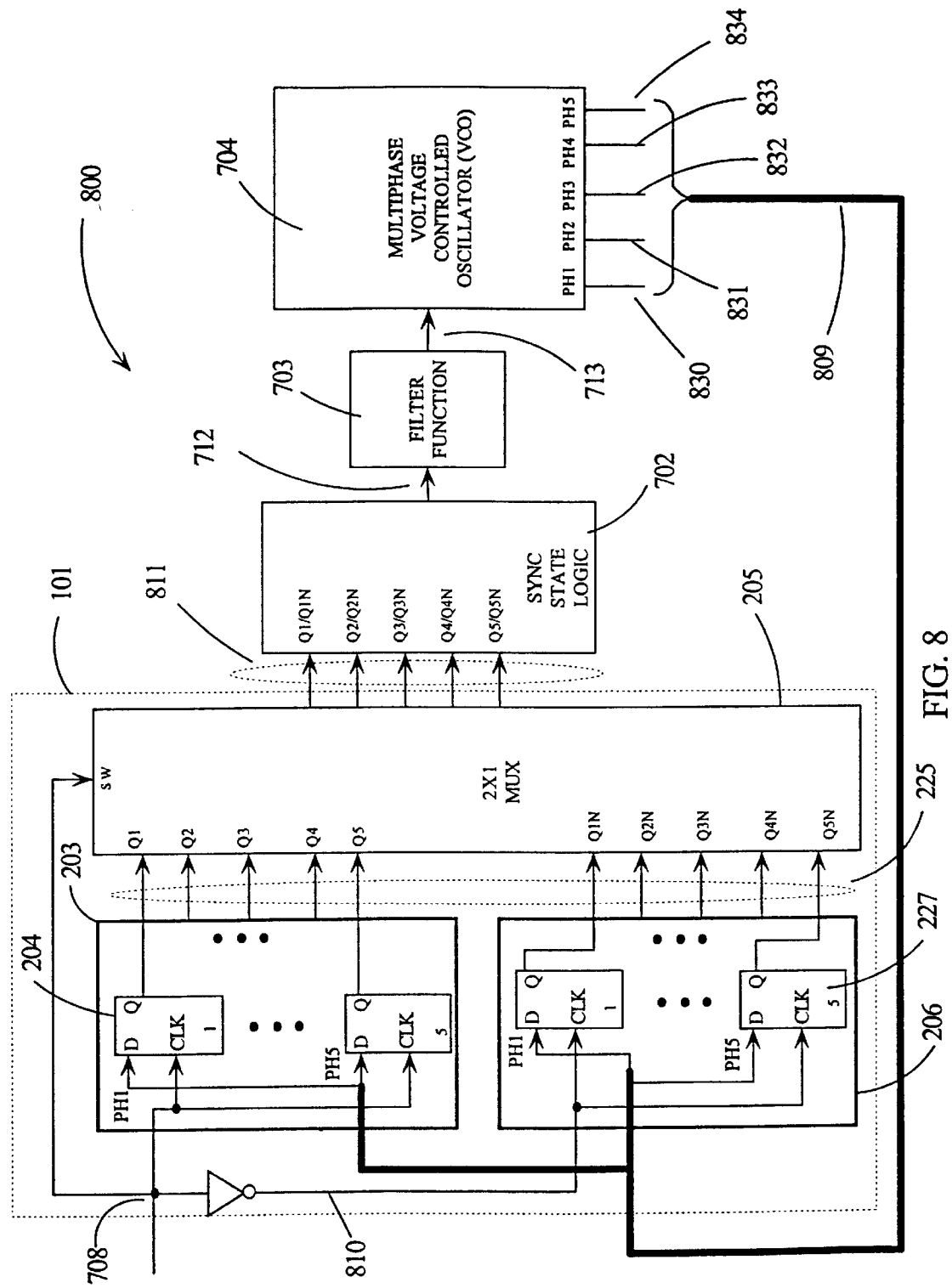
FIG. 8 is a more detailed block diagram of a multiphase detector used in an embodiment of the present invention.
Figure 9:
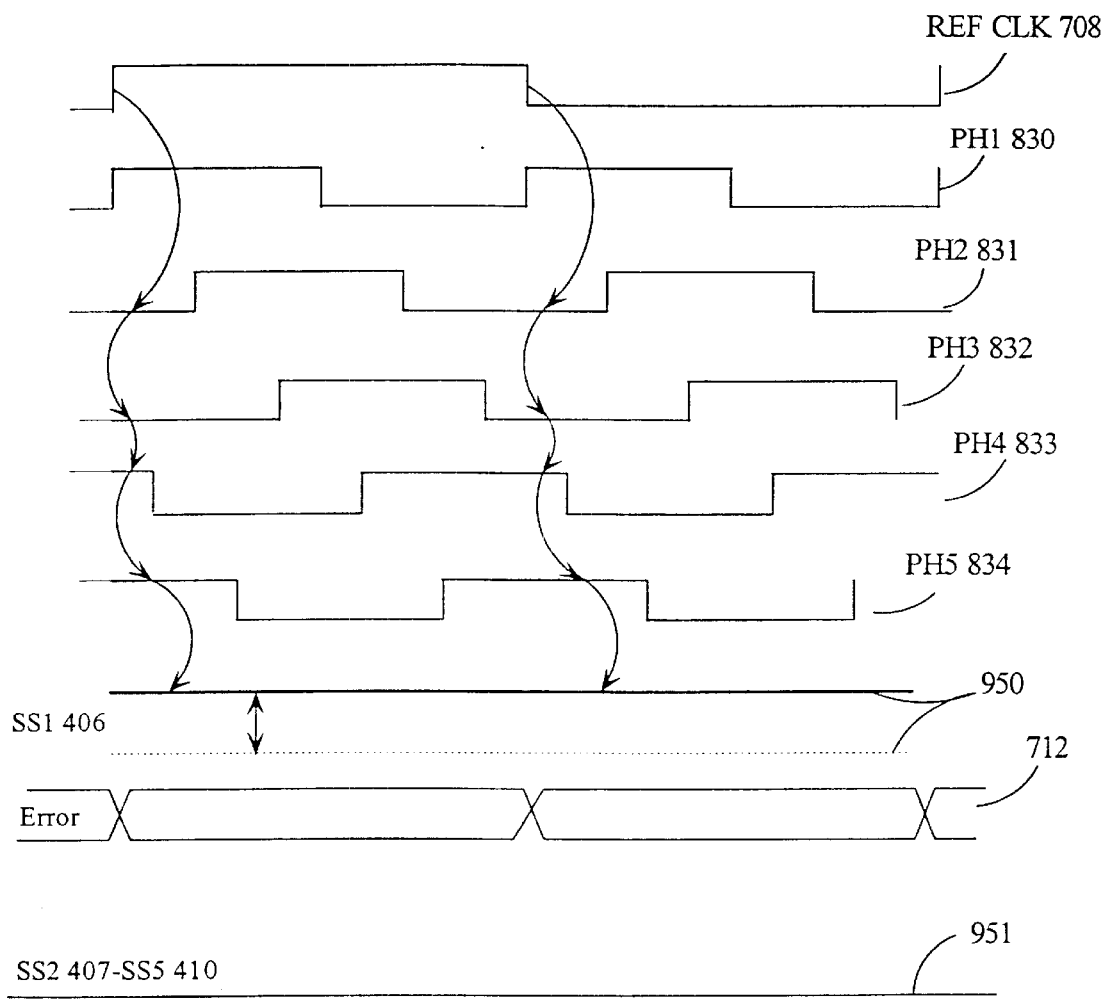
FIG. 9 is a timing diagram of signals in logic circuits used in an embodiment of the present invention.

FIG 8 is a more detailed block diagram of some of the circuit elements in FIG. 7. FIG. 8 is similar to FIG. 2, however, actual signals for the two embodiments are different and thus different reference numbers are used where necessary. Sampling units 203 and 206 receive the five phase outputs 809 of MPVCO 704 (PH1 830 through PH5 834) as the data inputs to D-Type FF (e.g., D-Type FF 204) and are sampled by clock reference 708 and inverted clock 810. FIG. 8 illustrates that the circuit configuration for the multiphase clock generation circuits 800 and the Quadrature clock generation circuits 200 may have similar circuit topologies. However, some of the circuitry used for the Quadrature clock 110 may not be used for the generation of multiphase clock 707 but was included to illustrate that the same circuit topology may be used for different types of clock generation. The higher frequency phase outputs of MPVCO 704, PH1 830 through PH5 834, are sampled by the lower frequency reference clock 708 and the outputs 811 of the MUX 205 within MP phase detector 101 are coupled to Sync State logic 702. Referring to FIG. 9, the timing waveforms show that sampling PH1 830 through PH5 834, at either the positive or negative edge of clock reference 708, generates only one Sync State of any interest, SS1 406. Depending on the phase and frequency lock between clock reference 708 and phases PH1 830 through PH5 834, SS1 406 will be either logic one or zero state (states 950). If SS1 406 is a logic one, then the transition state of PH1 830 will determine whether error signal 712 is either a logic one or zero. Error signal 712 is processed with filter function 703 (refer to FIG. 7) to produce the control voltage 713 for the MPVCO 704. The states of SS2 407 through SS5 410, for the case when SS1 406 is a logic one, are always a logic zero (state 951) when multiphase clock generator 800 is in a steady state condition.

FIG. 7 illustrates that the multiphase clock outputs 707 are generated by MPC circuit 706 from the phase outputs PH1 830 through PH5 834. FIG. 10 is a circuit diagram of a logic circuit operable to generate twenty phases of clock reference 708 using the five phase outputs PH1 830 through PH5 834, respectively. Referring to FIG. 10, each phase output of MPVCO 704 (PH1 830 through PH5 834) is coupled to two D-Type FFs (e.g., D-Type FF 911 and 912). D-Type FF 911 is configured so the output, Clock PH1 901, changes state on each positive transition of PH 830. Likewise, D-Type FF 912 is configured so that its output, Clock PH6 902, changes state on each negative transition of PH1 830. Each of the remaining phase outputs PH2 831 through PH5 834 are coupled to a pair of D-Type FFs as illustrated for PH1 830 thus generating clock phase outputs Clock PH1 901 through Clock PH10 910. It should be clear while the positive outputs of the D-Type FFs (e.g., D-Type FF 911 and 912 produce the first ten phases (1–10) of reference clock 708 the negative outputs (e.g., Clock PH11 951) produce the remaining ten phases (11–20) of reference clock 708.

Figure 11:
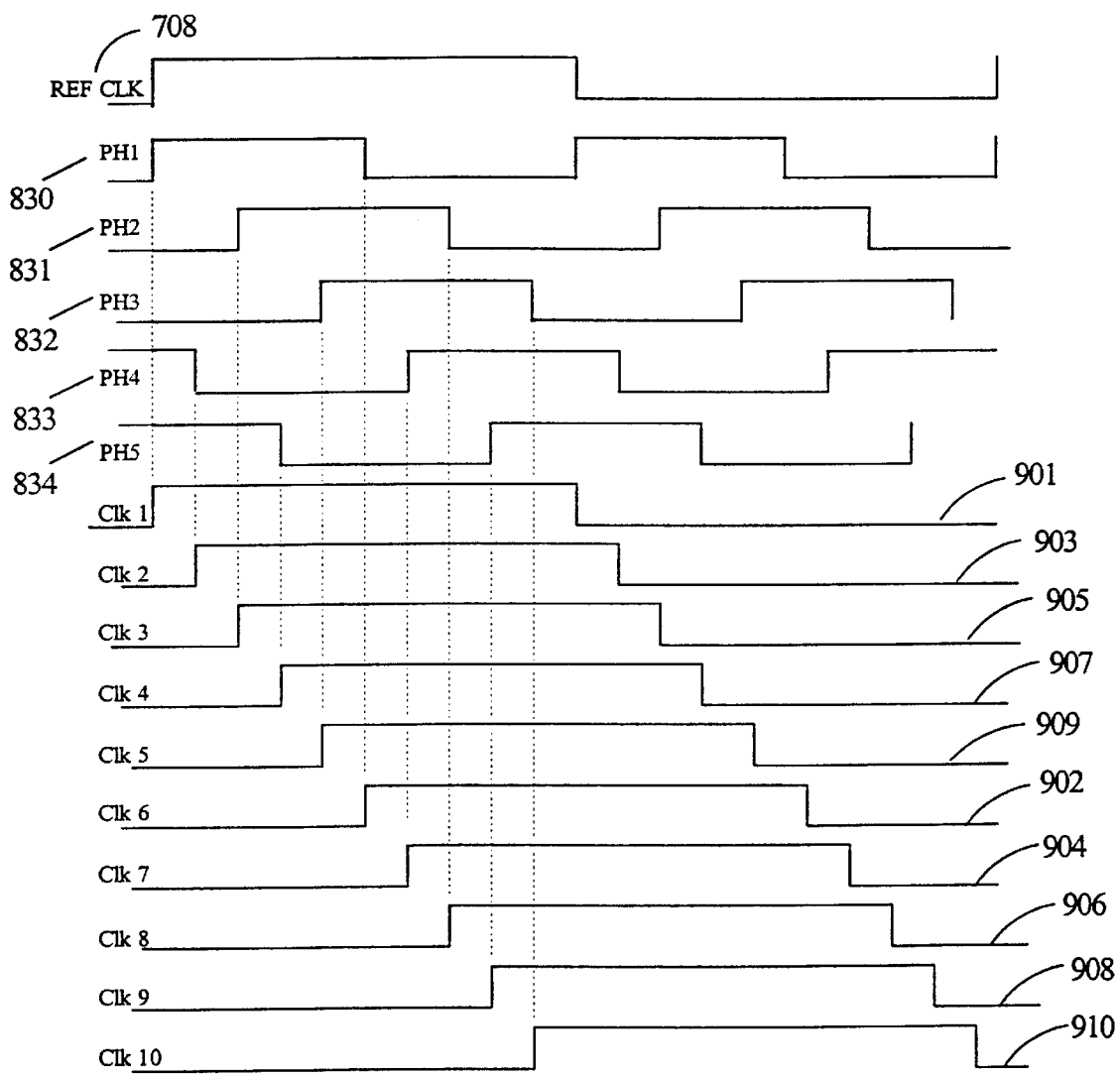
FIG. 11 is a timing diagram of signals in logic circuits used to generate twenty phases of a clock according to one embodiment of the present invention.

FIG. 11 is a timing diagram illustrating the waveforms for the twenty generated clock phases, Clock PH1 901 through Clock PH10 910 and their relationship to the reference clock 708 and the five phase outputs PH1 830 through PH5 834 of MPVCO 704. While FIG. 11 only shows the ten phases (1–10) of the first half of reference clock 708, it should be clear that the other ten phases (11–20) may be generated by using the negative or inverting output of the D-Type FFs in FIG. 10. For example Clock PH11 951 is the inversion of Clock PH1 901. The clock phases 11–20 are not shown in FIG. 11 to simplify the figure.

Figure 12:
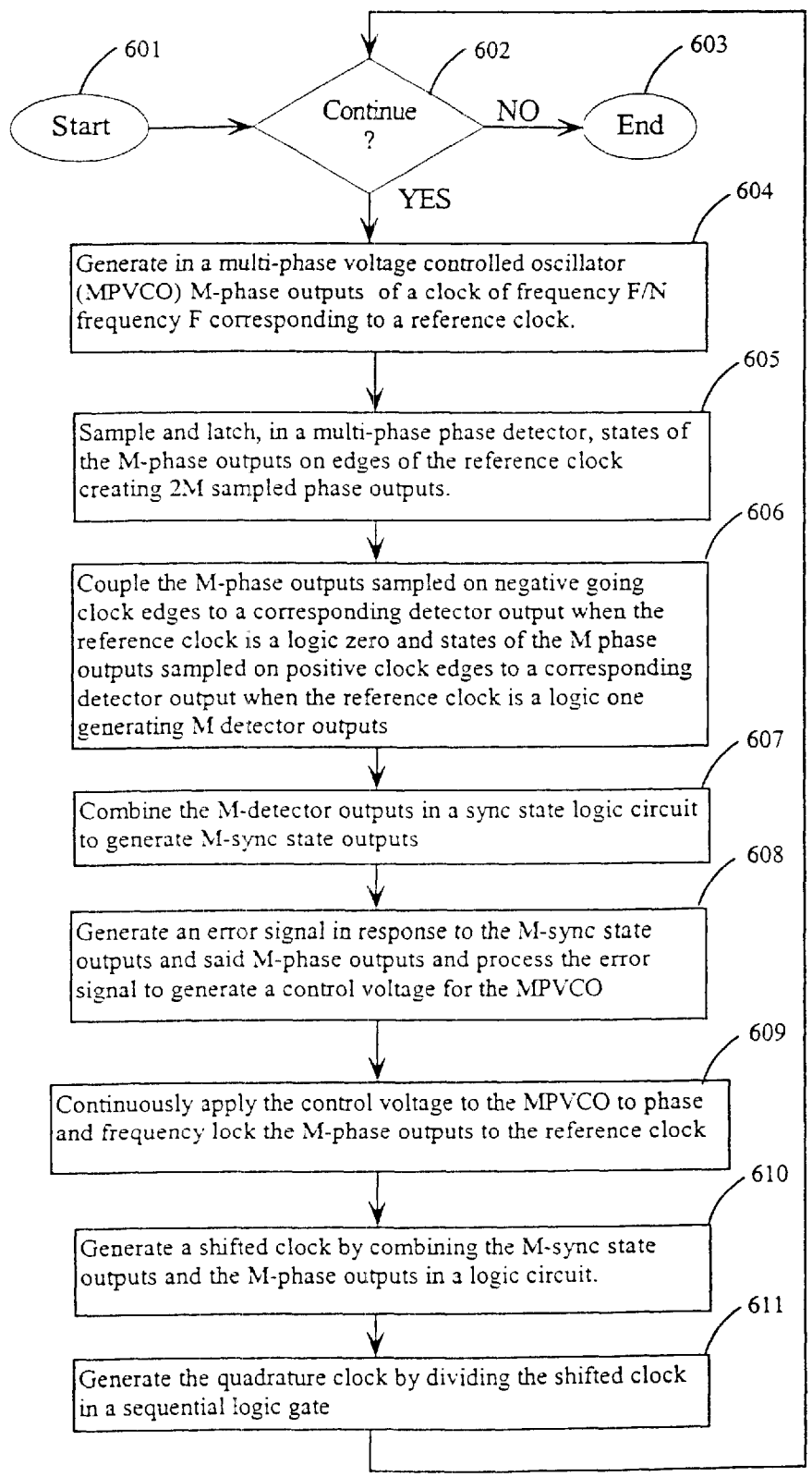
FIG. 12 is a flow diagram of the method for generating a quadrature clock according to an embodiment of the present invention.

FIG. 12 is a flow diagram of the process (method) for generating a Quadrature clock 110 for a particular reference clock with frequency F, without generating frequencies higher than F. In step 601, the process is started (e.g., a power up). In step 602, the process is continued in step 604 or ended in step 603. If the process is continued, then in step 604 M-phase outputs 109 of an MPVCO 104 are generated with a frequency F/N where N is greater than one and corresponding to reference clock 107. In step 605, the states of the M-phase outputs 109 are sampled and latched in MP phase detector 101 generating 2M-sampled phase outputs 225. In step 606, the states of M-phase outputs 109 (detected outputs 111), sampled on the positive edge of reference clock 107, are coupled to Sync State logic 102 when the reference clock is a logic one and the states of M-phase outputs 109 (detected outputs 111) sampled on the negative edge of reference clock 107 are coupled to inputs to Sync State logic 102 when the reference clock is a logic zero. In step 607, the M-detector outputs 111 are combined in the Sync State logic 102 to generate M-sync state outputs 108. In step 608, an error signal 112 is generated in response to the M-sync state outputs 108 and the error signal 112 is processed to produce a control voltage 113 for MPVCO 104. In step 609, the control voltage 113 is continuously applied to MPVCO 104 thereby causing the phase and frequency lock of the M-phase outputs to the reference clock. In step 610, a shifted clock 516 is generated by combining the M-sync state outputs 108 and the M-phase outputs 109 in Quadrature logic 106. In step 611, Quadrature clock 110 is generated by dividing shifted clock 516 in a sequential logic gate 518 where the non-inverting output 521 of D-Type FF 518 produces Quadrature output 110 by changing states on each positive edge of shifted clock 516. Generation of Quadrature clock 110 continues unless ended in step 603.

Figure 13:
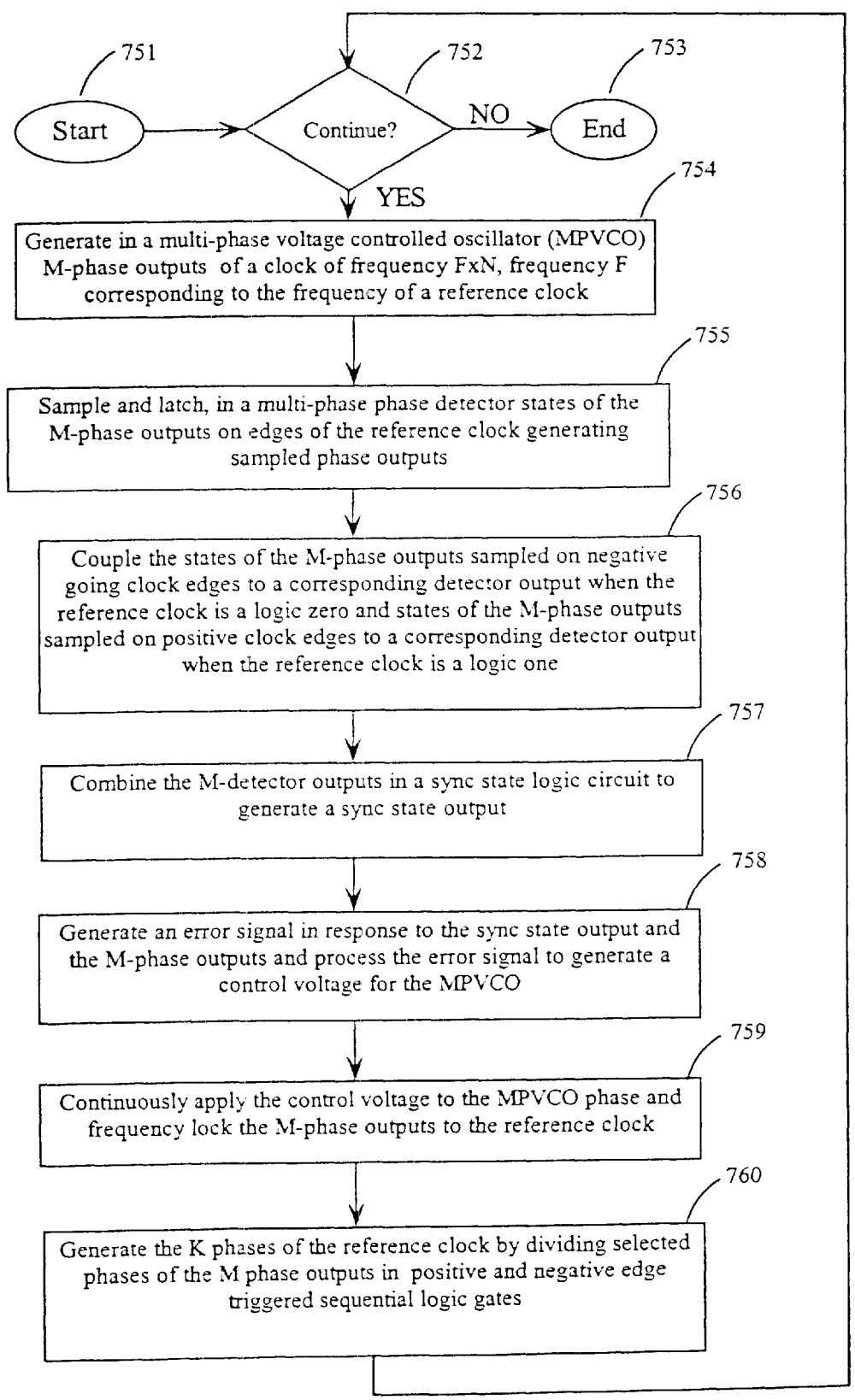
FIG. 13 is a flow diagram of the method for generating multiphase clocks according to another embodiment of the present invention.

FIG. 13 is a flow diagram of the process steps for generating K phases of a reference clock with frequency F by generating a clock of N×F where N is an integer greater than one. In a particular embodiment of the present invention, K is equal to twenty for N equal to two and M-equal to five. In step 751, the process starts (e.g., power up). From step 752, the process is either continued in step 754 or ended in step 753. If the process is continued, then in step 754 M-phase outputs 709 of an MPVCO 704 are generated which have a frequency 2F corresponding to frequency F of reference clock 708. In step 755, the states of the M-phase outputs 709 are sampled and latched in MP phase detector 101 generating 2M-sampled phase outputs 225. In step 756, the states of the M-phase outputs 809, sampled on the positive edge of reference clock 708, are coupled to inputs to Sync State logic 702 when the reference clock 708 is a logic one and the states of the M-phase outputs 709, sampled on the negative edge of reference clock 708 are coupled to M-detector outputs 711 when the reference clock is a logic zero. In step 757, the M-detector outputs 711 are combined in the Sync State logic 702 to generate M-sync state outputs. In step 758, an error signal 712 is generated in response to the M-sync state outputs and the error signal 712 is processed to produce a control voltage 713 for MPVCO 704. In step 759, the control voltage 713 is continuously applied to MPVCO 704 thereby causing the phase and frequency lock of the M-phase outputs 709 to the reference clock 708. In step 760, M-phases of reference clock 708 are generated by dividing each of the M-phase outputs 709 (e.g., PH1 830 through PH5 834) in sequential logic gates (D-Type FFs). In step 760, M-clock phases 707 are generated by dividing each of the M-phase outputs 709 with D-Type FFs (e.g., D-Type FF 911) which are triggered on the positive edges of the M-phase outputs and an additional M-clock phases 707 are generated with by dividing each of the M-phase outputs 709 with D-Type FFs (e.g., D-Type FF 912) which are triggered on the negative edges of the M-phase outputs 709. The process of generating the 4M-clock phases continues unless ended in step 753.

What is claimed is:

1. An apparatus for generating a quadrature clock of frequency F corresponding to a reference clock of frequency F comprising:
   a voltage controlled oscillator with M-phase outputs (MPVCO) having frequency F/N set in response to a control voltage where N is greater than one;
   an M-output phase detector (MPD) receiving said reference clock and said M-phase outputs of said MPVCO, said MPD generating M-detector outputs in response to 2M-sampled phase outputs of said M-phase outputs and said reference clock;
   a Sync State logic circuit receiving said M-detector outputs of said MPD, said Sync State logic circuit generating M-Sync State outputs and an error signal, said error signal processed to generate said control voltage; and
   a quadrature logic circuit receiving said M-phase outputs and said M-Sync State outputs, said quadrature logic circuit generating a quadrature clock with a frequency F corresponding to said reference clock in response to said M-phase outputs and said M-Sync State outputs.

2. The apparatus of claim 1, wherein said 2M-sampled phase outputs are generated by sampling and latching said M-phase outputs with both positive and negative going clock edges of said reference clock.

3. The apparatus of claim 1, wherein said MPD further comprises M, two input to one output, multiplexors (MUXs), each of said MUX having a first and a second MUX input and a MUX output, said MUX output corresponding to one of said M-detector outputs, and said first and second MUX inputs corresponding to a first and a second sampled phase output of said 2M-sampled phase outputs, respectively.

4. The apparatus of claim 3, wherein said first sampled phase output is generated by sampling a first one of said M-phase outputs with a positive going edge of said reference clock and said second sampled phase output is generated by sampling said first one of said M-phase outputs with a negative going edge of said reference clock.

5. The apparatus of claim 3, wherein said MUX output is generated by coupling a state of said first MUX input to said MUX output when a state of said reference clock is a logic one and coupling a state of said second MUX input to said MUX output when a state of said reference clock is a logic zero.

6. The apparatus of claim 1, wherein said Sync State logic circuit comprises M-sync logic gates having M−1 inputs and an output, each of said M-sync logic gates receiving selected M−1 of said M-detector outputs and generating one of said M-Sync State outputs.

7. The apparatus of claim 6, wherein each of said M-sync logic gates inverts a first and second of said M−1 detector outputs generating a first inverted and a second inverted input, each of said M-sync logic gates generating one of said M-Sync State outputs as a logic AND of said first and second inverted inputs and said remaining M−3 detector outputs.

8. The apparatus of claim 1, wherein said quadrature logic circuit comprises M-quadrature logic (M-QL) gates, each of said M-QL gates having a first and second QL input and a QL output, said first QL input coupled to a selected one of said M-phase outputs and said second QL input coupled to a selected one of said M-Sync State outputs.

9. The apparatus of claim 8, wherein each of said M-QL gates inverts said first QL input and performs a logic AND function on said inverted first QL input and said second QL input.

10. The apparatus of claim 8, wherein said M-QL outputs are combined in a first logic gate to generate a shifted clock, an output of said first logic gate coupled to an input of a first sequential logic gate, said first sequential logic gate operable to generate said quadrature clock in response to said shifted clock.

11. The apparatus of claim 10, wherein said first logic gate is an OR gate.

12. The apparatus of claim 10, wherein said first sequential logic gate is a D-Type flip flop (FF), having a data input, a clock input, an output, and an inverting output, said data input of said D-Type FF coupled said inverting output, said clock input coupled to said shifted clock, and said output generating said quadrature clock.

13. The apparatus of claim 12, wherein said D-Type FF is an edge triggered D-Type FF.

14. The apparatus of claim 1, wherein M is equal to 5 and N is equal to 2.5.

15. The apparatus of claim 1, wherein said MPVCO has a frequency adjustment range between F/2 and F/3.

16. The apparatus of claim 1, wherein said error signal is generated in response to said M-Sync State outputs and said M-phase outputs, said error signal operable to generate a control input voltage to said MPVCO, said frequency F/N of said MPVCO proportional to said control input voltage.

17. A method for generating a quadrature clock of frequency F corresponding to a reference clock of frequency F comprising:
  generating M-phase outputs in an M-phase voltage-controlled oscillator (MPVCO) having frequency F/N set in response to a control voltage where N is greater than one;
  generating M-phase detector outputs in an M-output phase detector (MPD) receiving said reference clock and said M-phase outputs of said MPVCO, said MPD generating M-detector outputs in response to 2M-sampled phase outputs of said M-phase outputs and said reference clock;
  generating M-Sync State outputs and an error signal in a Sync State logic circuit receiving said M-detector outputs of said MPD, said error signal processed to generate said control voltage; and
  generating a quadrature clock with a frequency F corresponding to said reference clock in a quadrature logic circuit receiving said M-phase outputs and said M-Sync State outputs.

18. The method of claim 17, wherein said 2M-sampled phase outputs are generated by sampling and latching said M-phase outputs with both positive and negative going clock edges of said reference clock.

19. The method of claim 17, wherein said MPD further comprises M, two input to one output, multiplexors (MUXs), each of said MUX having a first and a second MUX input and a MUX output, said MUX output corresponding to one of said M-detector outputs, and said first and second MUX inputs corresponding to a first and a second sampled phase output of said 2M-sampled phase outputs, respectively.

20. The method of claim 19, wherein said first sampled phase output is generated by sampling a first one of said M-phase outputs with a positive going edge of said reference clock and said second sampled phase output is generated by sampling said first one of said M-phase outputs with a negative going edge of said reference clock.

21. The method of claim 19, wherein said MUX output is generated by coupling a state of said first MUX input to said MUX output when a state of said reference clock is a logic one and coupling a state of said second MUX input to said MUX output when a state of said reference clock is a logic zero.

22. The method of claim 17, wherein said Sync State logic circuit comprises M-sync logic gates having M−1 inputs and an output, each of said M-sync logic gates receiving selected M−1 of said M-detector outputs and generating one of said M-Sync State outputs.

23. The method of claim 22, wherein each of said M-sync logic gates inverts a first and second of said M−1 detector outputs generating a first inverted and a second inverted input, each of said M-sync logic gates generating one of said M-Sync State outputs as a logic AND of said first and second inverted inputs and said remaining M−3 detector outputs.

24. The method of claim 17, wherein said quadrature logic circuit comprises M-quadrature logic (M-QL) gates, each of said M-QL gates having a first and second QL input and a QL output, said first QL input coupled to a selected one of said M-phase outputs and said second QL input coupled to a selected one of said M-Sync State outputs.

25. The method of claim 24, wherein each of said M-QL gates inverts said first QL input and performs a logic AND function on said inverted first QL input and said second QL input.

26. The method of claim 24, wherein said M-QL outputs are combined in a first logic gate to generate a shifted clock, an output of said first logic gate coupled to an input of a first sequential logic gate, said first sequential logic gate operable to generate said quadrature clock in response to said shifted clock.

27. The method of claim 26, wherein said first logic gate is an OR gate.

28. The method of claim 26, wherein said first sequential logic gate is a D-Type flip flop (FF), having a data input, a clock input, an output, and an inverting output, said data input of said D-Type FF coupled said inverting output, said clock input coupled to said shifted clock, and said output generating said quadrature clock.

29. The method of claim 28, wherein said D-Type FF is an edge triggered D-Type FF.

30. The method of claim 17, wherein M is equal to 5 and N is equal to 2.5.

31. The method of claim 17, wherein said MPVCO has a frequency adjustment range between F/2 and F/3.

32. The method of claim 17, wherein said error signal is generated in response to said M-Sync State outputs and said M-phase outputs, said error signal operable to generate a control input voltage to said MPVCO, said frequency F/N of said MPVCO proportional to said control input voltage.

33. An integrated circuit (IC) for generating a quadrature clock of frequency F corresponding to a reference clock of frequency F comprising:
  a voltage controlled oscillator with M-phase outputs (MPVCO) having frequency F/N set in response to a control voltage where N is greater than one;
  an M-output phase detector (MPD) receiving said reference clock and said M-phase outputs of said MPVCO, said MPD generating M-detector outputs in response to 2M-sampled phase outputs of said M-phase outputs and said reference clock;
  a Sync State logic circuit receiving said M-detector outputs of said MPD, said Sync State logic circuit generating M-Sync State outputs and an error signal, said error signal processed to generate said control voltage; and
  a quadrature logic circuit receiving said M-phase outputs and said M-Sync State outputs, said quadrature logic circuit generating a quadrature clock with a frequency F corresponding to said reference clock in response to said M-phase outputs and said M-Sync State outputs.

34. The IC of claim 33, wherein said 2M-sampled phase outputs are generated by sampling and latching said M-phase outputs with both positive and negative going clock edges of said reference clock.

35. The IC of claim 33, wherein said MPD further comprises M, two input to one output, multiplexors (MUXs), each of said MUX having a first and a second MUX input and a MUX output, said MUX output corresponding to one of said M-detector outputs, and said first and second MUX inputs corresponding to a first and a second sampled phase output of said 2M-sampled phase outputs, respectively.

36. The IC of claim 35, wherein said first sampled phase output is generated by sampling a first one of said M-phase outputs with a positive going edge of said reference clock and said second sampled phase output is generated by sampling said first one of said M-phase outputs with a negative going edge of said reference clock.

37. The IC of claim 35, wherein said MUX output is generated by coupling a state of said first MUX input to said MUX output when a state of said reference clock is a logic one and coupling a state of said second MUX input to said MUX output when a state of said reference clock is a logic zero.

38. The IC of claim 33, wherein said Sync State logic circuit comprises M-sync logic gates having M−1 inputs and an output, each of said M-sync logic gates receiving selected M−1 of said M-detector outputs and generating one of said M-Sync State outputs.

39. The IC of claim 38, and second of said M−1 detector outputs generating a first inverted and a second inverted input, each of said M-sync logic gates generating one of said M-Sync State outputs as a logic AND of said first and second inverted inputs and said remaining M−3 detector outputs.

40. The IC of claim 33, wherein said quadrature logic circuit comprises M-quadrature logic (M-QL) gates, each of said M-QL gates having a first and second QL input and a QL output, said first QL input coupled to a selected one of said M-phase outputs and said second QL input coupled to a selected one of said M-Sync State outputs.

41. The IC of claim 40, wherein each of said M-QL gates inverts said first QL input and performs a logic AND function on said inverted first QL input and said second QL input.

42. The IC of claim 40, wherein said M-QL outputs are combined in a first logic gate to generate a shifted clock, an output of said first logic gate coupled to an input of a first sequential logic gate, said first sequential logic gate operable to generate said quadrature clock in response to said shifted clock.

43. The IC of claim 42, wherein said first logic gate is an OR gate.

44. The IC of claim 42, wherein said first sequential logic gate is a D-Type flip flop (FF), having a data input, a clock input, an output, and an inverting output, said data input of said D-Type FF coupled said inverting output, said clock input coupled to said shifted clock, and said output generating said quadrature clock.

45. The IC of claim 44, wherein said D-Type FF is an edge triggered D-Type FF.

46. The IC of claim 33, wherein M is equal to 5 and N is equal to 2.5.

47. The IC of claim 33, wherein said MPVCO has a frequency adjustment range between F/2 and F/3.

48. The IC of claim 33, wherein said error signal is generated in response to said M-Sync State outputs and said M-phase outputs, said error signal operable to generate a control input voltage to said MPVCO, said frequency F/N of said MPVCO proportional to said control input voltage.

* * * * *

UNITED STATES PATENT AND TRADEMARK OFFICE
CERTIFICATE OF CORRECTION

PATENT NO. : 6,480,049 B2
DATED : November 12, 2002
INVENTOR(S) : David William Boerstler, Robert Keven Montoye and Kevin John Nowka It is certified that error appears in the above-identified patent and that said Letters Patent is hereby corrected as shown below:

Title page,
Item [57], ABSTRACT,
Line 3, following "generate" please insert -- a control --.

Column 1,
Line 4, before the "BACKGROUND INFORMATION", please insert
-- The present application is related to the following applications: "A HIGH-FREQUENCY LOW-VOLTAGE MULTIPHASE VOLTAGE CONTROLLED OSCILLATOR", serial no. 09/726,282 filed 11/30/00; "A MULTIPHASE VOLTAGE CONTROLLED OSCILLATOR WITH VARIABLE GAIN AND RANGE", serial no. 09/726,285 filed 11/30/00; and "MULTIPHASE CLOCK RECOVERY USING D-TYPE PHASE DETECTOR", serial no. 09/753,055 field 12/28/00. --
Line 4, following the "CROSS REFERENCE TO RELATED APPLICATIONS", please insert -- The present invention relates in general to clock generators and in particular to clock generators with simultaneous multiphase outputs. --

Signed and Sealed this

Twenty-fourth Day of February, 2004

JON W. DUDAS
*Acting Director of the United States Patent and Trademark Office*